United States Patent
Stradins et al.

(10) Patent No.: US 11,508,864 B2
(45) Date of Patent: Nov. 22, 2022

(54) TANDEM MODULE UNIT

(71) Applicant: Alliance for Sustainable Energy, LLC, Golden, CO (US)

(72) Inventors: Pauls Stradins, Golden, CO (US); Emily Lowell Warren, Golden, CO (US); Adele Clare Tamboli, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/995,378

(22) Filed: Aug. 17, 2020

(65) Prior Publication Data

US 2021/0050466 A1 Feb. 18, 2021

Related U.S. Application Data

(60) Provisional application No. 62/888,195, filed on Aug. 16, 2019.

(51) Int. Cl.
*H01L 31/0687* (2012.01)
*H01L 31/02* (2006.01)

(52) U.S. Cl.
CPC .... *H01L 31/0687* (2013.01); *H01L 31/02021* (2013.01)

(58) Field of Classification Search
CPC ............. H01L 31/0687; H01L 31/0725; H01L 31/076
See application file for complete search history.

(56) References Cited

U.S. PATENT DOCUMENTS

| | | | | |
|---|---|---|---|---|
| 4,338,480 A * | 7/1982 | Antypas | ................ | H01L 31/043 257/E25.007 |
| 4,387,265 A * | 6/1983 | Dalal | .................... | H01L 31/076 136/258 |
| 4,451,691 A * | 5/1984 | Fraas | ................ | H01L 31/03046 257/E31.022 |
| 4,513,168 A * | 4/1985 | Borden | ............... | H01L 31/0687 136/244 |
| 4,575,576 A * | 3/1986 | Ludowise | ........... | H01L 31/0687 136/244 |
| 7,148,417 B1 * | 12/2006 | Landis | ................ | H01L 31/0725 257/E31.022 |
| 8,563,850 B2 * | 10/2013 | Farris, III | ........... | H01L 31/0749 136/265 |
| 8,889,468 B2 * | 11/2014 | Lee | ..................... | H01L 31/1828 438/93 |
| 2003/0160251 A1 * | 8/2003 | Wanlass | .............. | H01L 31/0504 257/82 |

(Continued)

OTHER PUBLICATIONS

Arokiaraj, J. et al., "High-quality thin film GaAs bonded to Si using SeS2—A new approach for high-efficiency tandem solar cells," Solar Energy Materials & Solar Cells, vol. 66, 2001, 8 pages.

(Continued)

*Primary Examiner* — Golam Mowla
(74) *Attorney, Agent, or Firm* — Neal Vickery

(57) ABSTRACT

Presented herein are embodiments of a tandem solar panel subunit with 2-terminals, made from two 3-terminal cell tandems, whose top-cells are strongly current-mismatched to the Si 3-terminal bottom cell.

17 Claims, 7 Drawing Sheets

(56) References Cited

U.S. PATENT DOCUMENTS

| | | | | |
|---|---|---|---|---|
| 2005/0150542 A1* | 7/2005 | Madan | ............... | H01L 31/043<br>257/E25.007 |
| 2008/0230112 A1* | 9/2008 | Barnham | ............ | H01L 31/0475<br>136/246 |
| 2010/0051090 A1* | 3/2010 | Lee | ..................... | H01L 31/043<br>136/246 |
| 2010/0078059 A1* | 4/2010 | Lee | ...................... | H01L 31/18<br>257/E31.127 |
| 2010/0089440 A1* | 4/2010 | Gray | ................. | H01L 31/0304<br>136/255 |
| 2010/0089442 A1* | 4/2010 | Beasley | ............ | H01L 31/02021<br>136/255 |
| 2010/0122720 A1* | 5/2010 | Clark | ................. | H01L 31/0687<br>136/244 |
| 2010/0229921 A1* | 9/2010 | Farris, III | ........... | H01L 31/0749<br>136/249 |
| 2010/0263713 A1* | 10/2010 | Ludowise | .......... | H01L 31/0725<br>438/73 |
| 2011/0017298 A1* | 1/2011 | Lee | ..................... | H01L 31/043<br>438/95 |
| 2011/0244623 A1* | 10/2011 | Lee | .................... | H01L 31/0322<br>438/85 |

OTHER PUBLICATIONS

Bauhuis, G.J. et al., "26.1% thin-film GaAs solar cell using epitaxial lift-off," Solar Energy Materials & Solar Cells, vol. 93, 2009, 4 pages.

Connolly, J.P. et al., "Designing III-V multijunction solar cells on silicon," Progress in Photovoltaics: Research and Applications, vol. 22, 2014, 11 pages.

Derendorf, K. et al., "Fabrication of GaInP/GaAs//Si Solar Cells by Surface Activated Direct Wafer Bonding," IEEE Journal of Photovoltaics, vol. 3, No. 4, Oct. 2013, 6 pages.

Dimroth, F. et al., "Comparison of Direct Growth and Wafer Bonding for the Fabrication of GaInP/GaAs Dual-Junction Solar Cells on Silicon," IEEE Journal of Photovoltaics, vol. 4, No. 2, Mar. 2014, 6 pages.

Ersen, A. et al., "Direct Bonding of GaAs Films on Silicon Circuits by Epitaxial Liftoff," Solid State Electronics, vol. 36, No. 12, 1993, 9 pages.

Faine, P. et al., "The influence of spectral solar irradiance variations on the performance of selected single-junction and multijunction solar cells," Solar Cells, vol. 31, 1991, 20 pages.

Fernandez, E. F. et al., "Analysis of the spectral variations on the performance of high concentrator photovoltaic modules operating under different real climate conditions," Solar Energy Materials & Solar Cells, vol. 127, 2014, 9 pages.

Gee, J., "A Comparison of Different Module Configurations For Multi-Band-Gap Solar Cells," Solar Cells, vol. 24, 1988, 9 pages.

Hilali, M. M. et al., "High-efficiency (19%) Screen-printed Textured Cells on Low-resistivity Float-zone Silicon with High Sheet-resistance Emitters," Progress in Photovoltaics: Research and Applications, vol. 14, 2006, 10 pages.

Kinsey, G.S. et al., "Spectral Response and Energy Output of Concentrator Multijunction Solar Cells," Progress in Photovoltaics: Research and Applications, vol. 17, 2009, 10 pages.

Kurtz, S.R. et al., "The difference between standard and average efficiencies of multijunction compared with single-junction concenliator cells," Solar Cells, vol. 30, 1991, 13 pages.

Yang, J. et al., "Silicon-based Multi-junction Solar Cell With 19.7% Efficiency at 1-Sun Using Areal Current Matching for 2-Terminal Operation," Proceedings of 37th IEEE Photovoltaic Specialists Conference, 2011, 6 pages.

* cited by examiner

7(a)

7(b)

TANDEM MODULE UNIT

CROSS-REFERENCE TO RELATED APPLICATION

This application claims priority under 35 U.S.C. § 119 to U.S. provisional patent application No. 62/888,195 filed on 16 Aug. 2019, the contents of which are hereby incorporated in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

For integration into a module, 3T tandems present a difficulty associated with forming series connections of multiple units with three terminals. One possible solution was proposed by Gee (Solar Cells, 24 (1988) 147-155) relying on terminal 1 voltage $V_1$ being typically 2× that of the bottom terminal 2, $V_2$. In his paper, Gee also discusses complementary cell approach (n-p-n and p-n-p) in both series and voltage-matched configurations. Specifically, he refers to U.S. Pat. No. 4,575,576 wherein a scheme is proposed to connect two complementary 3-terminal cells to form a single 2-terminal unit. Their configuration utilizes bipolar transistor bottom cells (n-p-n and p-n-p), where the load terminals are the respective base terminals of the Si bottom cells. Because the base terminal's maximum current is limited by the photogenerated current in Si bottom cell, this configuration works well if the top cell's photocurrent is less or equal to that of the Si bottom cell. However, if the top cell generates more current than the Si three-terminal bottom cell, the 2-terminal device efficiency is restricted by the insufficient current in the load circuit.

Previous embodiments of tandem module units are limited to a 2-terminal composite unit wherein their configuration is different and only accommodates an "under-generating" top cell. It cannot accommodate an "over-generating" cell like GaAs or perovskite. Additionally, previous embodiments only describe 3-terminal Is bottom cells in bipolar transistor configuration.

SUMMARY

In an aspect, disclosed herein are methods to make tandem modules that can utilize both bipolar transistor configuration (with two p-n junctions in Si cell) and common emitter configuration (with only one p-n junction in Si cell), or combinations of both.

Other objects, advantages, and novel features of the present invention will become apparent from the following detailed description of the invention when considered in conjunction with the accompanying drawings.

DESCRIPTION OF THE DRAWINGS

FIG. 6 depicts a simulated constant power (efficiency) contours for a 3T stand-alone device (bottom or top 3T tandem device in FIG. 4). 0, 10, 20, 30% contours are shown in green, MPP point 31.94% in red, and 31.15% contour in black. Dotted line is fit to Eq. 5a.

FIG. 7a, configuration a, contains two 3T tandems on n-type wafer, one BJT (top) and the other CE (bottom). FIG. 7b, configuration b, has two common-emitter (CE) type 3T tandems, one based on n-type Si wafer, another on p-type Si wafer.

DETAILED DESCRIPTION

Disclosed herein are methods to present another configuration that accommodates "over-generating" top cells on three-terminal Si tandem, to form a two-terminal unit. This unit can then be incorporated into a module by simple series connections. It can use three-terminal tandems both in bipolar transistor (BJT) or common emitter (CE) configurations. This approach enables use of top-cell perovskites with bandgap less than 2× the Si bandgap, with photocurrent higher than that of the Si bottom cell. This approach also enables efficient GaAs—Si tandem.

Two-Terminal Units

Figure 1:
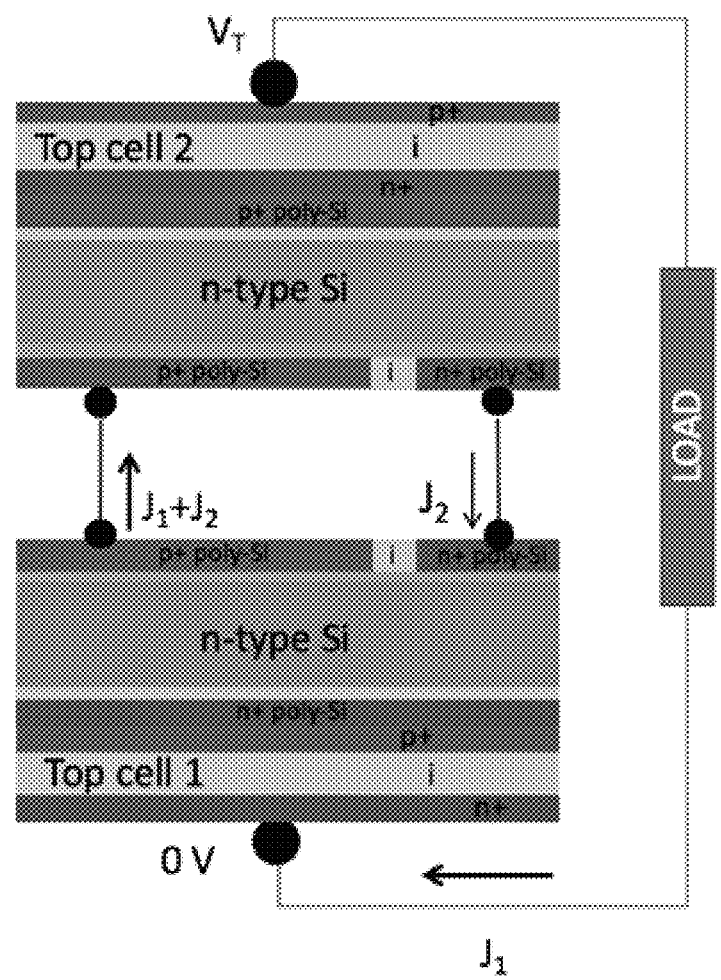
FIG. 1 depicts a two terminal unit with two n-type Si wafer based 3T tandem devices in the common emitter (bottom) and bipolar transistor (top) configurations.
Figure 2:
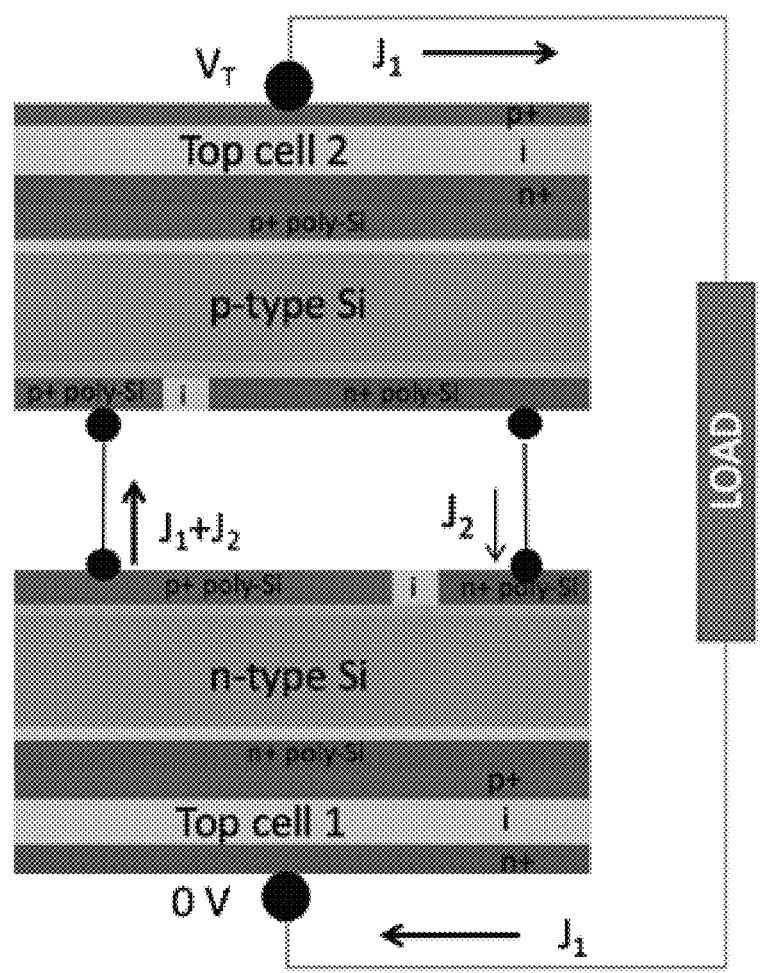
FIG. 2 depicts a two terminal unit with two 3T tandem devices both in the common emitter configuration. The bottom device is based on n-type Si wafer, common emitter p+ poly-Si contact. Top device is based on p-type Si wafer, common emitter n+ poly-Si.

FIGS. 1 and 2 show two device configurations that transform the 3-terminal tandem with "over-generating" top cell into a simple 2-terminal device. Both configurations consist of two 3-terminal (3T) tandem units. The respective top cells in those two units have opposite current directions with respect to the Si wafer. In an exemplary embodiment case, the "over-generating" top cell 3-terminal tandem, where the top cell generates 25 mA/cm² photocurrent, while the 3-terminal Si bottom cell generates 15 mA/cm² current.

As depicted in FIGS. 1-2, the two outer load circuit terminals are the terminals of the two top cells. Therefore, the maximum current in the load circuit is restricted by the photocurrent $J_1$ of the top cell(s). The bottom IBC terminals of the Si cell are connected as follows: p+ bottom to $p^+$ top, and $n^+$ bottom to the $n^+$ top.

Figure 3:
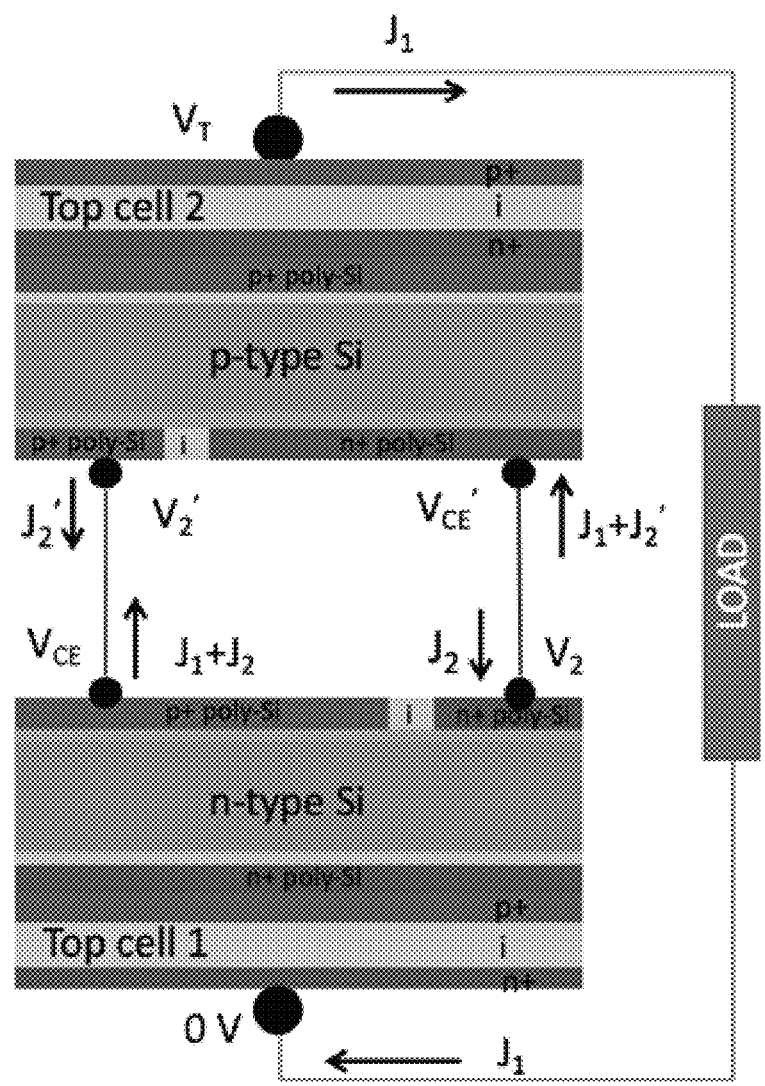
FIG. 3 depicts A unit composed of two common-emitter 3T-tandems of FIG. 1, with terminal currents detailed.

FIG. 3 depicts the currents and voltages that are established during the operation of two common emitter unit depicted in FIG. 2. Here, each of the 3-terminal tandems (n-wafer based and p-wafer based) is considered separately, and then conditions are established under which they can be joined in one unit of FIG. 1. The bottom 3T tandem unit (outlined by a dotted box) has top cell terminal with current $J_1$, IBC BSF terminal with current $J_2$, and p+ common emitter with current $J_1+J_2$. (Note that for n-type wafer, currents $J_1$ and $J_2$ are chosen as positive if they go into the wafer, while the common emitter current is leaving the wafer). The top, p-wafer based 3T-tandem also has a top cell 2 terminal current $J_1$, since it flows through the common load. It also has its IBC BSF terminal with $J_2'$ and a common emitter with current $J_1+J_2'$. (Note that for p-type wafer base, the current directions are reversed as compared to the bottom n-type wafer tandem).

When connected in one unit, the currents of the respective terminals should match, namely:

$$J_1+J_2=-J_2 \qquad (1a)$$

$$J_2=-(J_1+J_2') \qquad (1b)$$

Eqs. 1a and 1b are equivalent. In addition, the voltage differences should also match at both top and bottom IBC terminals:

$$V_{CE}-V_2=V_2'-V_{CE}' \qquad (2)$$

This match of Eq. 2 only happens when both the top and bottom 3T-tandems operate at identical current values (are at the "same state"). Then, since the current directions and voltages have opposite signs for the top and bottom units, the voltage differences in Eq. 2 will match. In addition, this means that $$J_2=J_2' \qquad (3)$$

From Eq. 1a we then obtain the current-and-voltage matching condition for the unit, $$J_1=-2J_2 \qquad (4),$$

so that, finally, the currents flowing between the top and bottom unit's IBC terminals are (see FIGS. 2 and 3):

$$J_1+J_2=J_1/2 \qquad (5a)$$

$$J_2=-J_1/2 \qquad (5b)$$

These currents are equal and flow in the same direction. The proposed one-unit system essentially divides the top cell current in half, and each IBC terminal connection carries this ½ current of the top cell $J_1$.

Note that in both configurations of FIGS. 1 and 2, the maximum currents provided by the Si cell through its common emitter or base terminal (for bipolar transistor) cannot exceed the Si cell's photocurrent $J_{L,Si}$, which is equal to a maximum value of $(J_1+J_2)_{max}$. When the top cell's light-generated half-current $(J_1/2)_{max}$ is equal to the maximum photogenerated current in 3T-Si cells, $(J_1+J_2)_{max}$, the current match is perfect, and the unit operates at its maximum efficiency. For Si bottom cells with about 40 mA/cm² light generated current at 1 sun (stand-alone), this happens when the top cell generates ⅔ of the total available current, i.e. 26.7 mA/cm², while the Si bottom cell is now generating 13.3 mA/cm² (½ of that of top cell). This is close to GaAs/Si or perovskite/Si tandems, where an embodiment of the proposed structure would operate close to the maximum efficiency. If $(J_1/2)_{max}$ is less than $(J_1+J_2)_{max}$, a fraction of light power generated in Si cells is lost to recombination in Si. Conversely, for $(J_1/2)_{max}>(J_1+J_2)_{max}$, part of the power is lost to recombination in top cells.

In an embodiment, disclosed is an example case for two connected 3T tandems in common emitter configuration (FIGS. 2-3), where each top cell generates 25 mA/cm² current and each 3T Si bottom cell generates 15 mA/cm². Simulations were done on two common-emitter 3T tandems with additional restrictions added by Eqs. 1-2. As the simulation results show, in this case at the maximum power point (MMP), each Si cell is operating at a current of 12.2 mA/cm², while the top cell operates at $J_{1,MMP}$=24.4 mA/cm². If the two 3T tandem units were independent, they would have the MPP currents of 24.4 and 14.4 mA/cm² for the top and bottom 3T cell, respectively.

Figure 4:
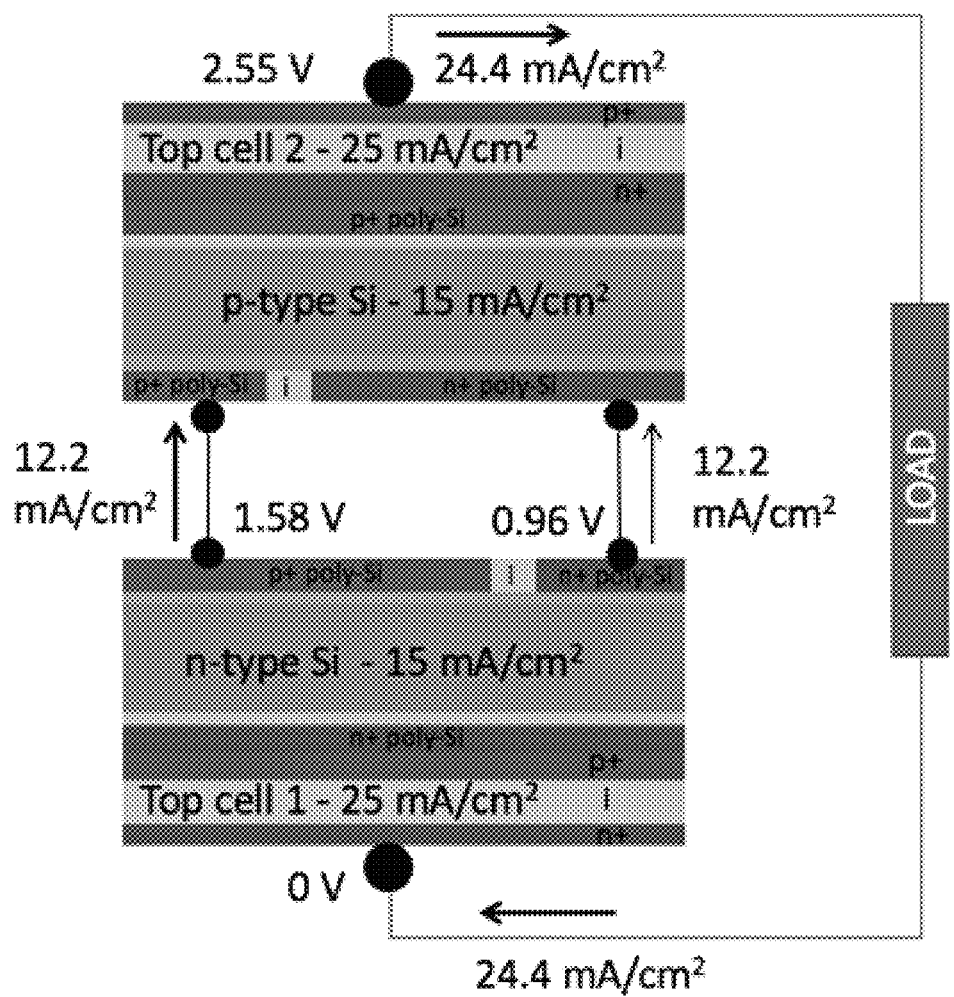
FIG. 4 depicts MPP condition currents and voltages simulated for the common emitter complementary cell tandem of FIG. 2. Each top cell generates 25 mA/cm² photocurrent current and each 3T Si bottom cell generates 15 mA/cm².

FIG. 4 shows the MPP case for 2×CE structure of FIGS. 2-3, with current and voltage values noted on the figure.

The currents, as well as voltage differences between the IBC terminals of in 3T tandem are the same both top and bottom units, however, note that the respective common emitters are connected to their counterpart BSF IBC terminals.

Figure 5:
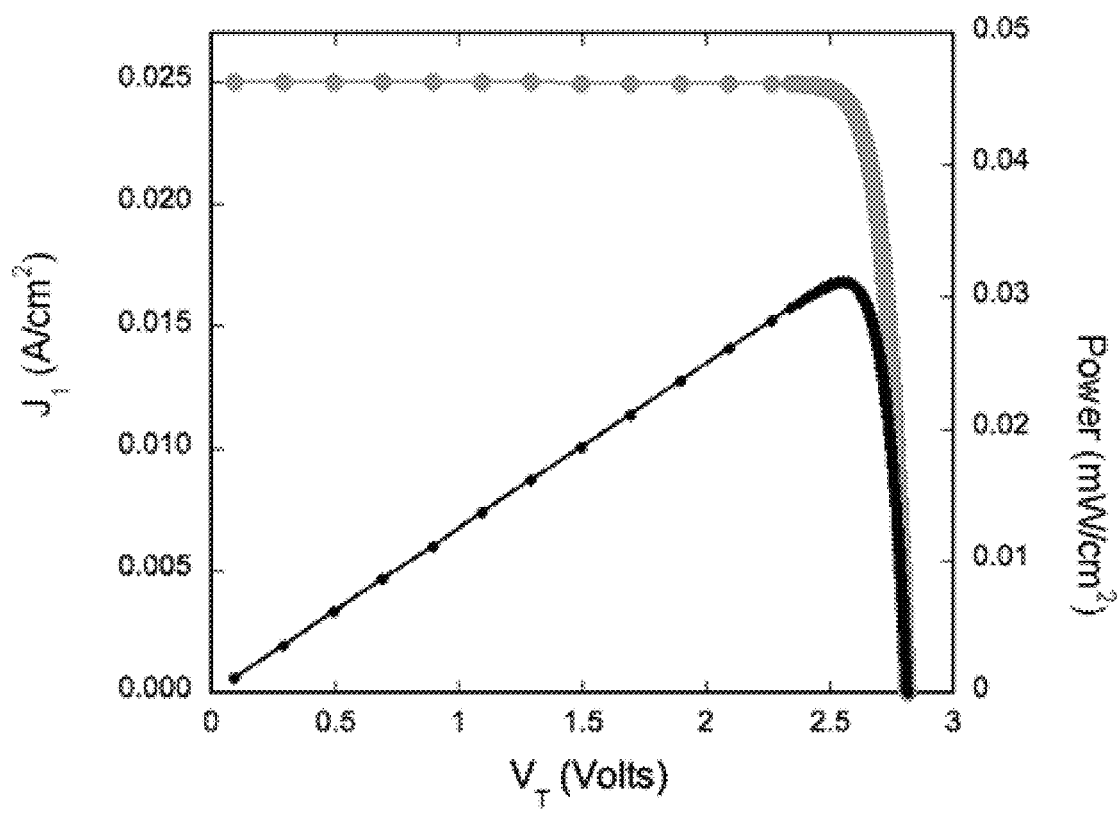
FIG. 5 depicts a J-V curve of the device structure shown on FIG. 4 (green symbols) and the generated power density (black).

The whole J-V curve of the FIG. 4 structure was simulated as well and is shown in FIG. 5. From FIG. 5 it was concluded that the top cells utilize all of their current 25 mA/cm². According to Eq. 5a, 3T tandem Si cells therefore can operate at a maximum current 12.5 mA/cm², which is 2.5 mA/cm² short of their photogenerated current of 15 mA/cm². Despite this, the maximum power efficiency is very high, 31.15%. The same two 3T tandems operated independently, gave maximum efficiency 31.94%. In this case, top cell at MPP also operated at 24.4 mA/cm², but the 3T bottom cell carried at MPP the Si diode current $J_1+J_2$=14.4 mA/cm² (see detailed comparison below in discussion of Table I).

Figure 6:
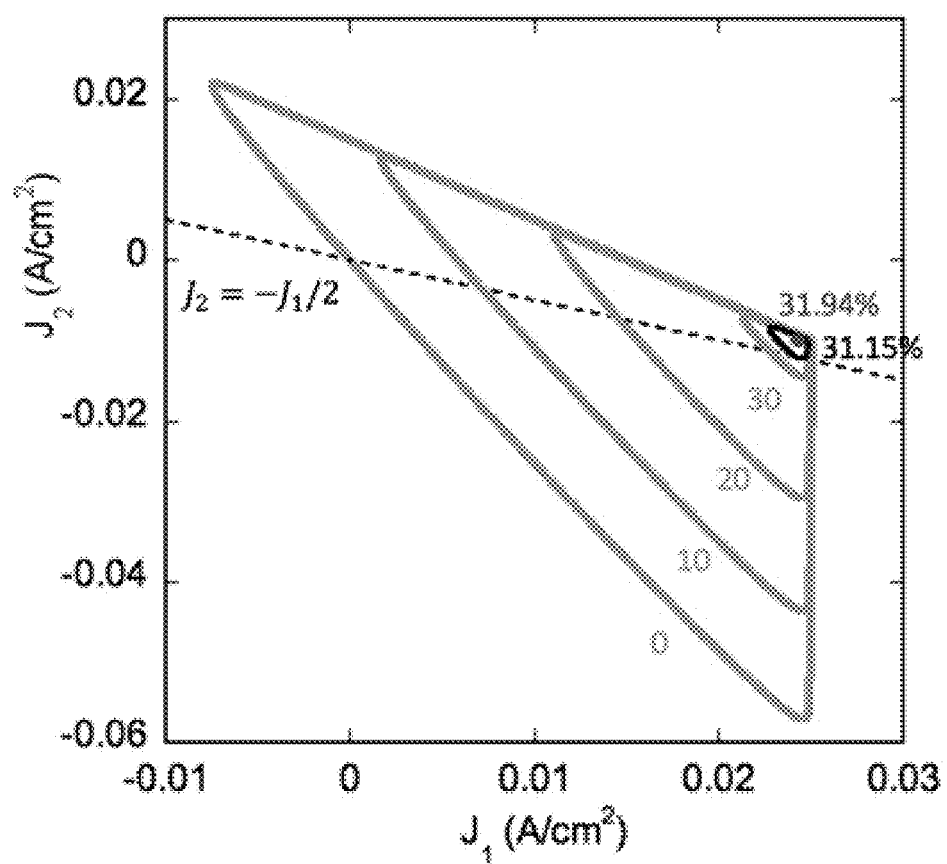

Finally, FIG. 6 shows the constant power contours in current plane $J_1J_2$ for the bottom 3T tandem of FIG. 4. They are shown together with the relationship between currents $J_1$ and $J_2$, that enables our 2T device: $J_2=-J_1/2$ (see Eq. 5b), dotted black line. The dotted fit line in FIG. 6 is tangent to a 31.15% efficiency contour of a single 3T tandem device. This is an MPP condition for the device of FIG. 4. The maximum power point for a single 3T device (31.94% efficiency) is nearby in the plane as shown by a red dot.

Table I summarizes the performance of the device of FIGS. 4-5 and compares it with performance of a single 3T tandem as well as with its components: the top cell and 3T bottom cell operated independently.

TABLE I

A comparison of cell operating parameters and maximum efficiencies for the device of FIG. 4, stand-alone 3T tandem with the same 3T Si bottom IBC cell as in FIG. 4; and a tandem composed of a-stand-alone top and 3T bottom cells.

|  | Top cell (25 mA/cm²) | Bottom 3T Si cell (15 mA/cm²) | Total efficiency |
|---|---|---|---|
| This device (FIG. 4) | 24.41 mA/cm²; $V_{top}$ = 0.979 V; 23.87% | $J_1$ = 24.4; $J_2$ = −12.2 mA/cm²; $V_1$ = 0.607; $V_2$ = 0.618 V 7.28% | 31.15% |
| Stand-alone 3T tandem | 24.3 mA/cm²; $V_{top}$ = 0.983 V; 23.89% | $J_1$ = 24.3; $J_2$ = −10.0 mA/cm²; $V_1$ = 0.573; $V_2$ = 584 V 8.05% | 31.94% |
| Stand-alone top cell plns stand-alone 3T Si cell | 24.3 mA/cm²; $V_{top}$ = 0.984 V; $V_{OC}$ = 1.076 V 23.89% | $J_{mpp}$ = 2 × 7.1 = 14.2 mA/cm²; $V_{1,mpp}$ = $V_{2,mpp}$ = 0.575 V 8.22% | 32.2% |

Four-Terminal Units

Besides the two-terminal units for incorporation into a solar module (see FIGS. 1 and 2), it is also possible to realize the same way of current matching the top cell in a 4-terminal unit. It is less practical for incorporation into a module because of the two load circuits involved, yet it also makes possible to string the units together into a module. FIG. 7 shows two possible configurations that satisfy these conditions. Both are double-tandem structures composed of the same 3T-tandem units as in FIGS. 1 and 2, but wired together and to the loads differently. In an embodiment the "over-generating" 25t15b structures are disclosed herein. Other configurations are possible to accommodate different 3T tandem modes.

Figure 7A:
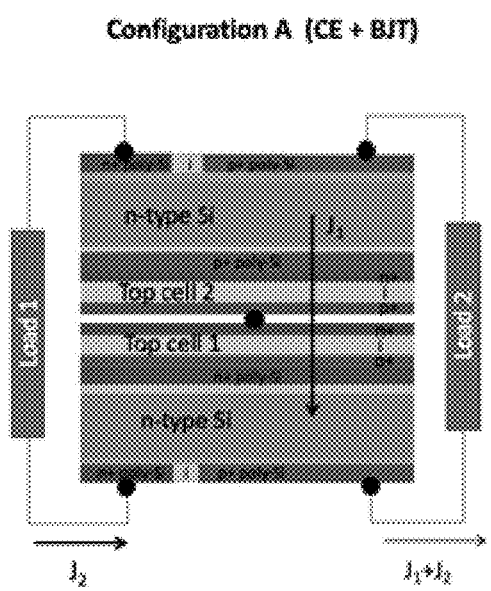
FIGS. 7a and 7b depict a double-tandem 25t15b structure in two configurations. Terminal voltages shown are approximate values expected when both 25t15b top and bottom 3T tandems are near their MPP.
Figure 7B:
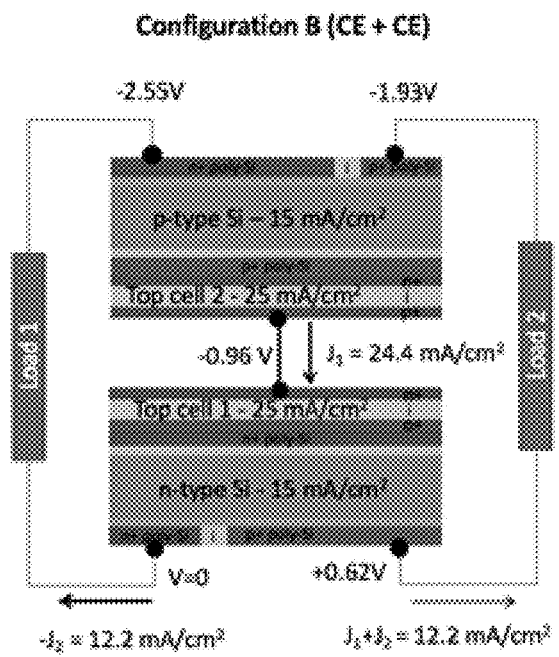

As depicted in FIGS. 7a and 7b, configuration A (FIG. 7a) contains two 3T tandems on n-type wafer, one BJT (top) and the other CE (bottom). Configuration B (see FIG. 7b) has two common-emitter (CE) type 3T tandems, one based on n-type Si wafer, another on p-type Si wafer. These double-tandems have their top-cell grids joined as a common terminal, while the four other terminals can connect to two separate outer load circuits. In an embodiment, simulations show that both configurations A and B perform almost identically.

As depicted in FIG. 7b (Configuration. B), simulated voltage values and currents are noted, with respect to the bottom left terminal, at the MPP condition. In this case, every p-n or n-p junction in Si will have voltage drop of about 0.62V, while the top cell will have diode voltage of about 0.96V. This results in top terminal voltages −2.55V and −1.93V. Note that: 1) the voltage difference between the two top and two bottom terminals is the same, +0.62V, and 2) the voltage drops across Load 1 and Load 2 are the same, 2.55V. Therefore, if another Configuration B double-tandem device is connected "on top" of an existing Configuration B, their currents and voltages will match. In an embodiment, a string of series-connected double tandems is constructed forming two circuits; one for the load on the left and one for the right.

Simulations of both structures (CE+BJT and CE+CE) of FIG. 7 show that they have maximum power conversion efficiencies of 31.15%, same as for the 2-terminal structure of FIG. 4. The currents in both load circuits FIG. 7 are the same at the MPP condition, each current (J2 or J1+J2) being 12.2 mA/cm$^2$, same as for the connected IBC terminals in FIG. 4.

Thus, disclosed herein is a tandem solar panel subunit with 2-terminals, composed from two 3-terminal cell tandems, whose top-cells are strongly current-mismatched to the Si 3-terminal bottom cell. The top cell "over-generates" photocurrent by about a factor of two in comparison to the bottom cell. The proposed technique could maximize power output from perovskite-Si and GaAs—Si tandems. The proposed module subunit can utilize 3T tandem cells both in common emitter and in bipolar transistor configurations. In an embodiment, depicted herein is at least one other way to create module subunits with four terminals and two load circuits.

The foregoing disclosure has been set forth merely to illustrate the invention and is not intended to be limiting.

We claim:

1. A tandem solar panel subunit comprising 2-terminals comprising:
    two 3-terminal tandem cells,
        wherein each of the two 3-terminal tandem cells further comprising a top-cell and a Si 3-terminal bottom cell,
        wherein the top-cell of each of the two 3-terminal tandem cells is current-mismatched to the Si 3-terminal bottom cell of the respective 3-terminal tandem cell, and
        wherein two terminals of each of the Si 3-terminal bottom cells are common terminals.

2. The solar panel subunit of claim 1 wherein the top-cells generate photocurrent up to about 25 mA/cm$^2$ at 1 sun.

3. The solar panel subunit of claim 1 wherein the top-cells generate photocurrent with a voltage up to about 0.979V at 1 sun.

4. The solar panel subunit of claim 1 wherein the top-cells generate photocurrent at an efficiency up to about 23.9% at 1 sun.

5. The solar panel subunit of claim 1 wherein the Si 3-terminal bottom cells generate photocurrent up to about 15 mA/cm$^2$ at 1 sun.

6. The solar panel subunit of claim 1 wherein the Si 3-terminal bottom cells generate photocurrent with a first voltage up to about 0.607V at 1 sun.

7. The solar panel subunit of claim 1 wherein the Si 3-terminal bottom cells generate photocurrent with a second voltage up to about 0.618V at 1 sun.

8. The solar panel subunit of claim 1 wherein the top-cells generate photocurrent at an efficiency up to about 7.3% at 1 sun.

9. The solar panel subunit of claim 1 wherein the solar panel subunit generates photocurrent at an efficiency up to about 31.2% at 1 sun.

10. The solar panel subunit of claim 1 wherein the top cell generates up to twice the amount of photocurrent as the Si 3-terminal bottom cell.

11. A method of making a tandem solar panel subunit comprising 2-terminals comprising:
    two 3-terminal tandem cells,
        wherein each of the two 3-terminal tandem cells further comprising a top-cell and a Si 3-terminal bottom cell,
        wherein the top-cell of each of the two 3-terminal tandem cells is current-mismatched to the Si 3-terminal bottom cell of the respective 3-terminal tandem cell, and
        wherein two terminals of each of the Si 3-terminal bottom cells are common terminals.

12. The method of claim 11 wherein the solar panel subunit of claim 1 wherein the top-cells generate photocurrent up to about 25 mA/cm$^2$ at 1 sun.

13. The method of claim 11 wherein the solar panel subunit of claim 1 wherein the top-cells generate photocurrent with a voltage up to about 0.979V at 1 sun.

14. The method of claim 11 wherein the solar panel subunit of claim 1 wherein the top-cells generate photocurrent at an efficiency up to about 23.9% at 1 sun.

15. The method of claim 11 wherein the solar panel subunit of claim 1 wherein the Si 3-terminal bottom cells generate photocurrent up to about 15 mA/cm$^2$ at 1 sun.

16. The method of claim 11 wherein the solar panel subunit of claim 1 wherein the top-cells generate photocurrent at an efficiency up to about 7.3% at 1 sun.

17. The method of claim 11 wherein the solar panel subunit of claim 1 generates photocurrent at an efficiency up to about 31.2% at 1 sun.

* * * * *